United States Patent
Seidl et al.

(10) Patent No.: US 7,170,125 B2
(45) Date of Patent: Jan. 30, 2007

(54) CAPACITOR WITH ELECTRODES MADE OF RUTHENIUM AND METHOD FOR PATTERNING LAYERS MADE OF RUTHENIUM OR RUTHENIUM

(75) Inventors: Harald Seidl, Feldkirchen (DE); Martin Gutsche, Dorfen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/724,134

(22) Filed: Dec. 1, 2003

(65) Prior Publication Data

US 2004/0152255 A1 Aug. 5, 2004

(30) Foreign Application Priority Data

Nov. 29, 2002 (DE) ............................... 102 55 841

(51) Int. Cl.
  *H01L 29/72* (2006.01)
(52) U.S. Cl. ................... 257/301; 257/303; 257/306; 257/516; 257/532; 257/906; 257/924
(58) Field of Classification Search ................ 257/68, 257/71, 296, 301, 303, 306, 516, 532, 906, 257/924, E27.092, E29.346, E21.396
  See application file for complete search history.

(56) References Cited

U.S. PATENT DOCUMENTS

| | | | |
|---|---|---|---|
| 5,254,217 A * | 10/1993 | Maniar et al. .............. | 438/608 |
| 5,624,583 A | 4/1997 | Tokashiki et al. | |
| 5,973,351 A * | 10/1999 | Kotecki et al. ............. | 257/310 |
| 5,976,928 A * | 11/1999 | Kirlin et al. ................ | 438/240 |
| 6,146,963 A * | 11/2000 | Yu ............................. | 438/396 |
| 6,664,186 B1 * | 12/2003 | Callegari et al. ........... | 438/681 |
| 2001/0005026 A1 | 6/2001 | Nakamura | |
| 2001/0006245 A1 | 7/2001 | Yunogami et al. | |
| 2002/0070194 A1 | 6/2002 | Nakahara et al. | |
| 2002/0132194 A1* | 9/2002 | Ono et al. .................. | 430/329 |
| 2002/0197793 A1* | 12/2002 | Dornfest et al. ............ | 438/253 |
| 2004/0092073 A1* | 5/2004 | Cabral et al. ............... | 438/287 |

FOREIGN PATENT DOCUMENTS

WO  WO 01/17014 A1  3/2001

* cited by examiner

*Primary Examiner*—George Fourson
*Assistant Examiner*—Joannie Adelle Garcia
(74) *Attorney, Agent, or Firm*—Slater & Matsil, L.L.P.

(57) ABSTRACT

A method for patterning layers made of ruthenium or ruthenium(IV) oxide and a capacitor comprising at least one electrode which is constructed from ruthenium or ruthenium (IV) oxide at least in sections. A layer made of ruthenium or ruthenium(IV) oxide is deposited on a substrate and said layer is subsequently covered with a covering layer at least in sections. Through heat treatment of the construction thus obtained in an oxygen atmosphere, the ruthenium is converted into $RuO_4$ in the uncovered sections and removed by sublimation. The method enables the simple patterning of layers made of ruthenium or ruthenium(IV) oxide and the construction of complex structures, such as trench capacitors, for example.

18 Claims, 7 Drawing Sheets

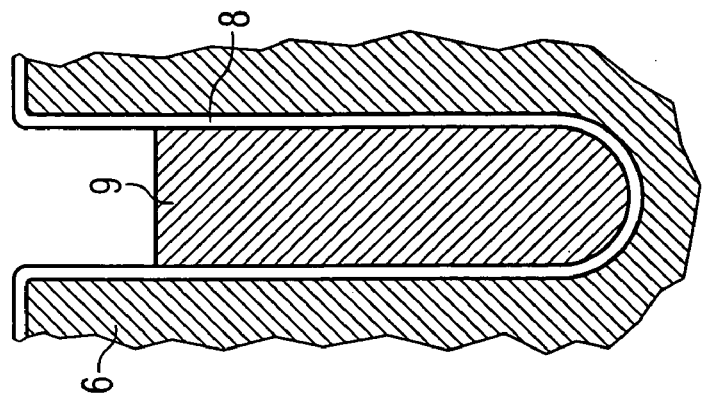
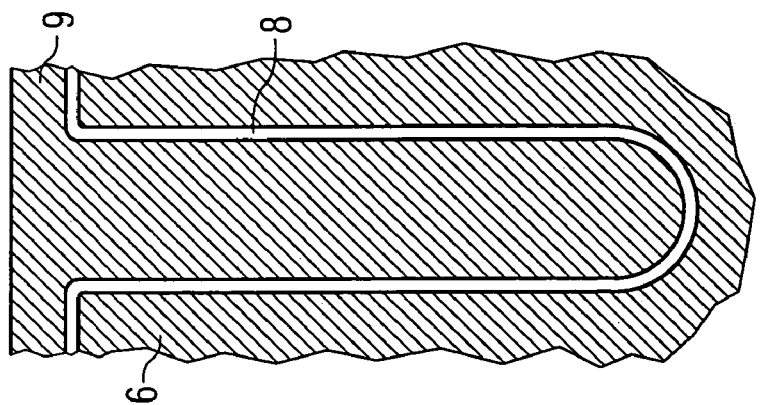
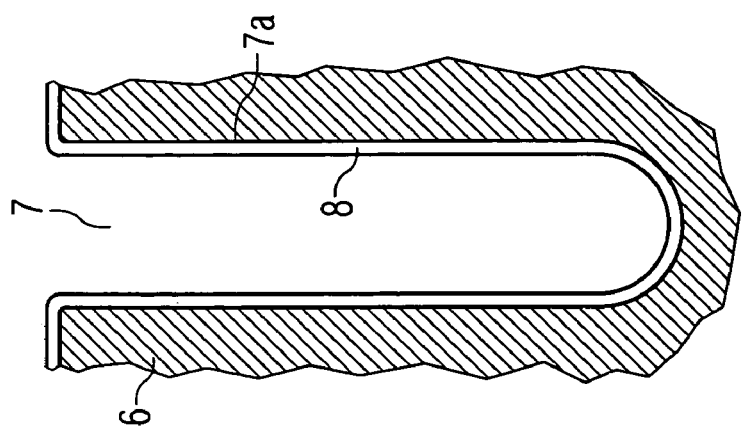
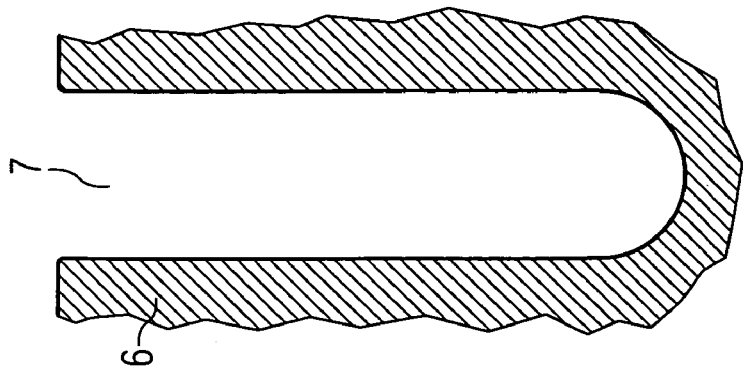

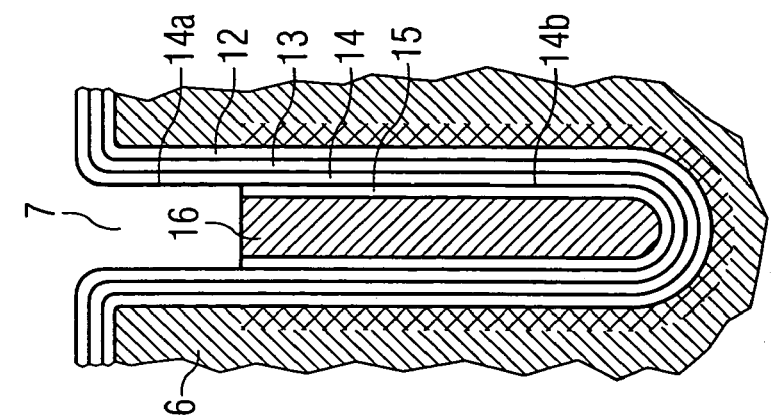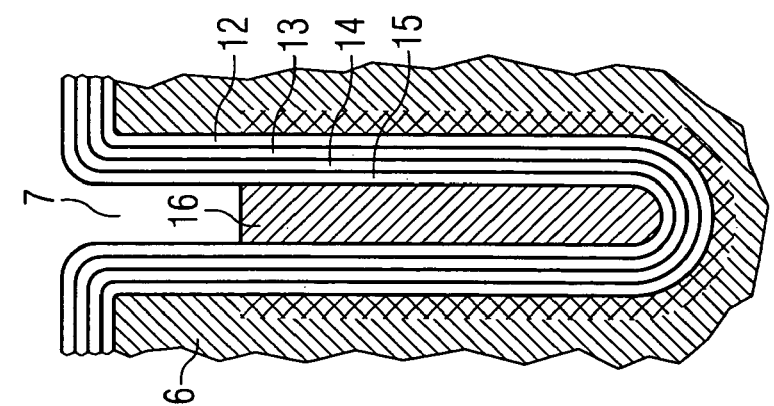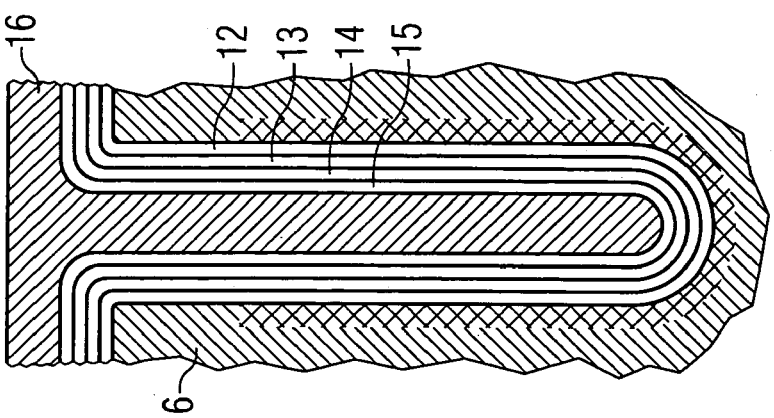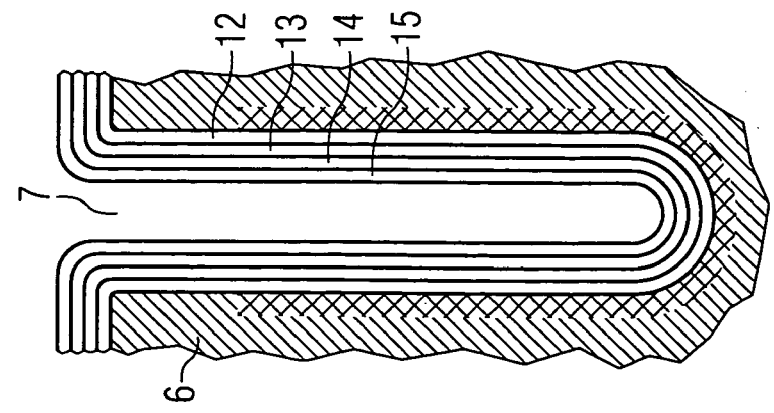

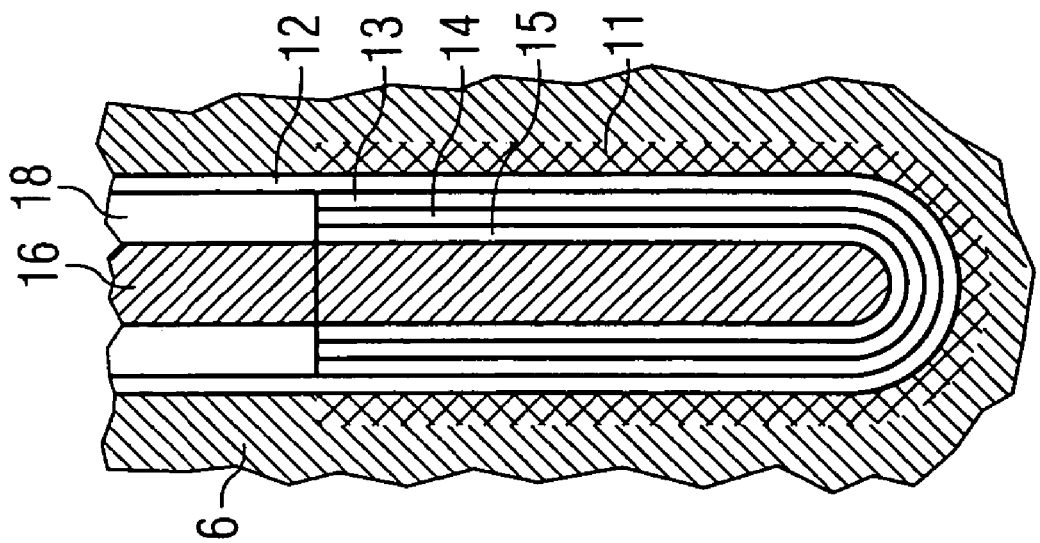
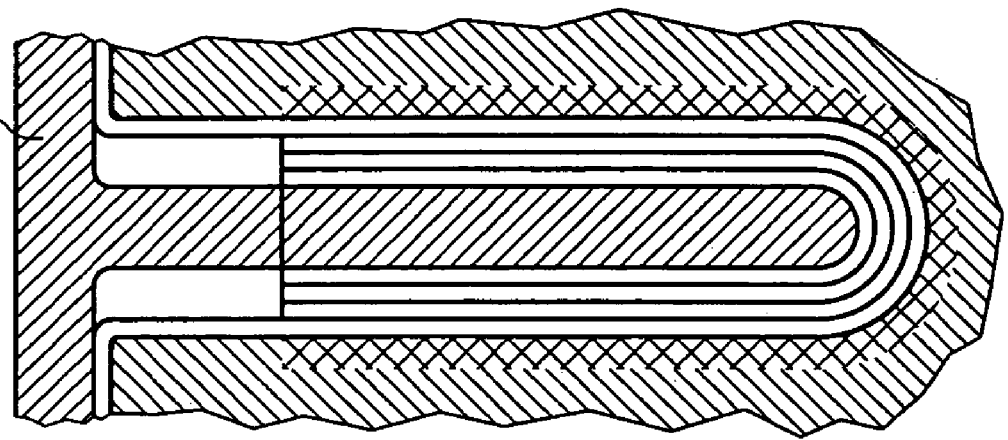

CAPACITOR WITH ELECTRODES MADE OF RUTHENIUM AND METHOD FOR PATTERNING LAYERS MADE OF RUTHENIUM OR RUTHENIUM

BACKGROUND

1. Field of the Invention

The invention relates to a method for patterning layers made of ruthenium or ruthenium(IV) oxide and to a capacitor.

2. Background Information

Economic success in the semiconductor industry is substantially influenced by a further reduction of the minimum feature size which can be produced on a microchip. Reducing the minimum feature size makes it possible to increase the integration density of the electronic components such as transistors or capacitors on the microchip and thus to increase the computing speed of processors and also to increase the storage capacity of memory modules. In order that the area required by the components on the chip surface is kept small, the depth of the substrate is also utilized in the case of capacitors. To that end, firstly a trench is introduced into the wafer. Afterward, a bottom electrode is produced for example by the regions of the wafer which adjoin the wall of the trench being doped in order to increase the electrical conductivity. A thin layer of a dielectric is then applied to the bottom electrode. Finally, the trench is filled with an electrically conductive material in order to obtain a counterelectrode. The latter electrode is also referred to as top electrode. This arrangement of electrodes and dielectric means that the capacitor is, as it were, folded. Given electrode areas of constant size, that is to say the same capacitance, the lateral extent of the capacitor on the chip surface can be minimized. Such capacitors are also referred to as trench capacitors or "deep trench" capacitors.

In memory chips, the charged and discharged states of the capacitor correspond to the two binary states 0 and 1. In order to be able to reliably determine the charge state of the capacitor and thus the information stored in the capacitor, the latter must have a specific minimum capacitance. If the capacitance or, in the case of a partly discharged capacitor, the charge falls below this value, the signal disappears in the noise, that is to say the information about the charge state of the capacitor is lost. After writing, the capacitor is discharged by leakage currents which bring about a charge balancing between the two electrodes of the capacitor. In order to counteract a loss of information through the discharge of the capacitor, in DRAMs the charge state of the capacitor is checked at regular intervals and if appropriate refreshed, that is to say a partly discharged capacitor is charged again up to its original state. However, technical limits are imposed on these so-called "refreshing" times, that is to say they cannot be shortened arbitrarily. During the period of the refreshing time, therefore, the charge of the capacitor is permitted to decrease only to an extent such that reliable determination of the charge state is possible. For a given leakage current, the capacitor must therefore have a specific minimum charge at the beginning of the refreshing time, so that, at the end of the refreshing time, the charge state is still high enough above the noise to be able to reliably read out the information stored in the capacitor. With decreasing dimensions, the leakage currents increase since tunneling effects gain in importance. In order to be able to ensure a reliable storage of information even with advancing miniaturization, the capacitor must have a sufficient capacitance. In order to obtain the desired high capacitance despite a decreasing structural size, a multiplicity of solution approaches are being pursued. Thus, by way of example, the surface of the electrodes is provided with a structure in order that, as the length and width of the electrodes decrease, the surface thereof is made as large as possible. Furthermore, new materials are being used. Thus, attempts are being made to replace the silicon dioxide, which has been used hitherto as dielectric, by materials with a higher dielectric constant.

In order to achieve a highest possible capacitance for a given size of a capacitor, attempts are furthermore being made to dope as highly as possible that region of the semiconductor which directly adjoins the dielectric, in order thus to produce a highest possible charge density in the electrode in direct proximity to the dielectric. The doping may be effected from a solid phase, those sections of the semiconductor which are to be doped being covered with an arsenic glass, for example. Through heat treatment, the arsenic ions then diffuse from the arsenic glass into the semiconductor. A doping from the gas phase is also possible, for example using $AsH_3$. To that end, however, those sections of the semiconductor which are intended to remain free of a doping must be protected by a corresponding covering layer. If silicon is used as semiconductor material, a space charge zone also forms in the case of high doping, said space charge zone representing a parasitic capacitance and thus further reducing the surface charge density of the capacitor. In order to suppress the formation of a space charge zone, as capacitor dimensions decrease further, procedures are changing over to forming the electrodes from metals or other electrically highly conductive materials. Examples of appropriate materials for the electrode layers are Al, TaSiN, WSiN, TiAlN, WSi, MoSi, CoSi, W, WN, Ta, TaN, Ti, TiN, Hf, HfN, Zr, ZrN, Mo, MoN, Y, YN, La, LaN, Ce, CeN, TiSiN, WSiN, or similar materials. Customary dry or wet etching processes are used in the patterning of the metal layers or the layers made of electrically highly conductive materials. These etching processes must proceed selectively with respect to other materials, in particular with respect to silicon, silicon oxide and also silicon nitride. These methods are usually very complicated to carry out and, moreover, are not available for all metals or electrically highly conductive materials. There is therefore a need for improved fabrication techniques.

SUMMARY

It is an object of the invention, therefore, to provide a method for fabricating and patterning layers which have a high electrical conductivity.

The object is achieved by means of a method for patterning layers made of ruthenium or ruthenium(IV) oxide, having the following steps:

Provision of a substrate with a substrate surface,

Deposition of a layer made of ruthenium or ruthenium (IV) oxide on at least sections of the substrate surface;

Deposition of a covering layer that is inert with respect to oxygen on at least sections of the layer made of ruthenium or ruthenium(IV) oxide, thereby obtaining sections covered by the covering layer and uncovered sections of the layer made of ruthenium or ruthenium (IV) oxide;

Heat treatment of the substrate in an oxygen-containing atmosphere, so that the uncovered sections of the layer made of ruthenium or ruthenium(IV) oxide are removed.

The use of ruthenium or ruthenium(IV) oxide (RuO$_2$) provides a material which has a high electrical conductivity. This enables the fabrication of very thin electrodes, for example for capacitors, for which reason the dimensions thereof and thus the area required on the top side of a substrate can also be reduced further. In the method according to the invention, the patterning of the layer made of ruthenium or ruthenium(IV) oxide can be performed very simply since the ruthenium or ruthenium(IV) oxide is converted into a sublimatable compound. This is achieved by exposing the layer made of ruthenium or ruthenium(IV) oxide to an oxygen-containing atmosphere, so that the ruthenium or the ruthenium(IV) oxide is converted into volatile ruthenium oxides. Ruthenium forms various volatile oxides. Ruthenium(VIII) oxide boils at a temperature of about 100° C. At relatively high oxygen partial pressure, the ruthenium(VIII) oxide arises from ruthenium or ruthenium (IV) oxide at temperatures above about 800° C., while the volatile ruthenium(VI) oxide arises at higher temperatures in the range above about 1200° C. and low oxygen partial pressure. The reaction is carried out at a temperature and an oxygen partial pressure at which, on the one hand, a sufficiently high rate of conversion of the ruthenium or ruthenium(IV) oxide is achieved and, on the other hand, the volatile ruthenium oxide that has arisen sublimates away from the substrate surface. The patterning of the ruthenium layer or the layer made of ruthenium(IV) oxide can therefore be carried out very simply. In order to achieve a patterning, those regions of the layer made of ruthenium or ruthenium (IV) oxide which are intended to remain on the substrate must be protected from the oxygen-containing atmosphere. To that end, these sections are covered with a covering layer which is inert with respect to oxygen. The covering layer may suitably be formed from an oxide which remains on the substrate surface in stable fashion under conditions under which the ruthenium(VIII) oxide or the ruthenium(VI) oxide is sublimated away. A suitable oxide is silicon dioxide, for example. In this case, the covering layer does not have to be formed from the oxide throughout. The covering layer may, for example, also be formed from an element that is not readily volatile, for example a metal, which is oxidized at its surface. Thus, it is also possible, for example, to use a covering layer made of polysilicon which is passivated with an oxide layer at its surface. The oxide layer protects the polysilicon from further oxidation in the oxygen-containing atmosphere. Polysilicon is suitable as covering layer particularly if the layer made of ruthenium or ruthenium(IV) oxide is to be formed on relief structures. If necessary, the patterning of the covering layer may be carried out by customary methods. After specific sections of the layer made of ruthenium or ruthenium(IV) oxide have been protected by the covering layer, the substrate is subjected to heat treatment in an oxygen-containing atmosphere, the uncovered ruthenium or ruthenium(IV) oxide being converted into a sublimatable ruthenium oxide, with the result that the uncovered sections of the layer made of ruthenium or ruthenium(IV) oxide are removed.

Depending on whether or not the covering layer already forms a constituent part of a microelectronic component to be constructed, the covering layer may remain on the layer made of ruthenium or ruthenium(IV) oxide or else be removed after patterning. Customary methods are used to remove the covering layer. The precise conditions are dependent in each case on the material used for the covering layer. With the use of layers made of silicon dioxide, the covering layer can be removed, for example, wet-chemically by means of aqueous hydrofluoric acid or else in a fluorine-containing plasma.

The conditions for the heat treatment of the substrate are preferably chosen so as to cause a least possible thermal loading. On the other hand, however, the temperature must be chosen to be high enough to ensure that the conversion into volatile ruthenium oxides takes place within time periods that are of interest for industrial application. Preferably, for heat treatment purposes the substrate is heated to a temperature of more than 800° C. Ruthenium(VIII) oxide forms at these temperatures, and can be sublimated away from the substrate surface under these conditions. At higher temperatures or given a low oxygen content of the oxygen-containing atmosphere, the volatile ruthenium(VI) oxide (RuO$_3$) may also form at temperatures above 1200° C. This means a high thermal loading of the substrate, so that the temperature used for heat treatment is preferably chosen to be below 1200° C.

The more readily volatile ruthenium(VIII) oxide (RuO$_4$) preferably forms when there is a high proportion of oxygen in the oxygen-containing atmosphere. Therefore, the oxygen-containing atmosphere is preferably essentially formed from oxygen. Inert gases or traces of other compounds may also be contained in addition to oxygen. If possible, however, these should not impede the formation of the more readily volatile RuO$_4$. The conversion into volatile ruthenium oxide is preferably carried out at normal pressure.

The method according to the invention is suitable in particular for the fabrication of electrodes of trench capacitors. The low electrical resistance makes it possible on the one hand to achieve a high surface charge density, as a result of which the dimensions of the capacitor can be minimized further. On the other hand, the low resistance makes it possible to shorten the access time to the capacitor or storage element of a memory chip. For the fabrication of trench capacitors, the procedure is preferably such that a substrate is used into which trenches are introduced. Said trenches have trench walls on which the layer made of ruthenium or ruthenium(IV) oxide is deposited at least in sections. After a corresponding patterning, said layers made of ruthenium or ruthenium(IV) oxide can then form the electrode of a capacitor, for example.

BRIEF DESCRIPTION OF THE DRAWINGS

The invention is explained in more detail with reference to the accompanying. In this case, identical objects are designated by identical reference symbols.

DETAILED DESCRIPTION

A list of reference symbols is provided below.

| | |
|---|---|
| 1 | Substrate |
| 2 | Layer made of ruthenium or ruthenium(IV) oxide |
| 3 | Covering layer |
| 4 | Mask |
| 5 | Patterned layer made of ruthenium or ruthenium(IV) oxide |

-continued

| | |
|---|---|
| 6 | Silicon substrate |
| 7 | Trench |
| 7a | Trench wall |
| 8 | Layer made of arsenic glass |
| 9 | Filling made of resist |
| 10 | Layer made of covering oxide |
| 11 | Doped region |
| 12 | Dielectric |
| 13 | First conductive barrier layer |
| 14 | Layer made of ruthenium |
| 15 | Second barrier layer |
| 16 | Polysilicon |
| 17 | Oxide layer |
| 18 | Collar |

Figure 1A:
FIGS. 1A–E show a diagrammatic illustration of the work steps which are run through in the fabrication of a patterned layer made of ruthenium or ruthenium(IV) oxide.
Figure 1B:
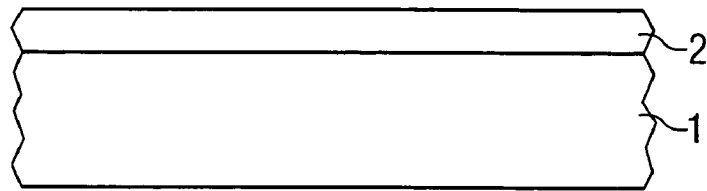
Figure 1C:
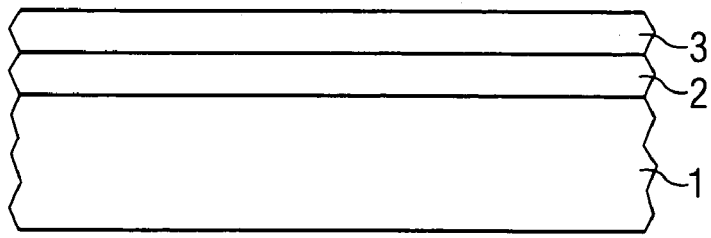

FIGS. 1A–E shows a diagrammatic illustration of the work steps which are run through in the method according to the invention. FIG. 1A illustrates in lateral view a section through a substrate 1, for example a silicon wafer. The construction of the substrate 1 is not subject to any particular limitations. By way of example, the substrate 1 may also comprise a plurality of layers arranged one above the other. Thus., an epitaxially deposited layer made of monocrystalline silicon or a layer made of silicon dioxide may be arranged on the silicon wafer. Equally, it is also possible for components already to be integrated into the wafer, for example trenches. For the sake of clarity, such layers or structures integrated in the substrate 1 are not illustrated. Firstly, a layer 2 made of ruthenium or ruthenium(IV) oxide is deposited onto the substrate 1. The deposition is effected by customary methods, for example a CVD method (CVD=Chemical Vapor Deposition) or an ALD method (ALD=Atomic Layer Deposition). A gaseous precursor compound that may be used for the ruthenium is, by way of example, a ruthenium halide which is converted into the ruthenium metal using hydrogen or into the ruthenium(IV) oxide using an oxygen-containing precursor compound. Examples of further suitable precursor compounds are organometallic compounds of ruthenium, such as $Ru(dpm)_3$(tris (dipivaloylmethanato)ruthenium). Suitable precursor compounds are described for example in M.-K. Kadoshima, T. Nabatame, M. Hiratani, Y. Nakamura, I. Asano, T. Suzuki Jpn. J. Appl. Phys. 41 (2002), L347–L350, Part 2, No. 3B, and K.-W. Kim, N.-S. Kim, Y.-S. Kim, I.-S. Choi, H.-J. Kim, J.-C. Park, S.-Y. Lee Jpn. J. Appl. Phys. 4 (2002) 820–825 Part 1, No. 2A. Water or ozone, for example, may be used for the deposition of the oxygen of the ruthenium(IV) oxide. The construction illustrated in FIG. 1B is obtained, in which a layer 2 made of ruthenium or ruthenium(IV) oxide is arranged on the substrate 1. In the next method step, illustrated in FIG. 1C, a covering layer 3 is deposited onto the layer 2 made of ruthenium or ruthenium(IV) oxide. The material of the covering layer 3 is chosen such that, on the one hand, it is inert with respect to oxygen and, on the other band, it can be removed selectively with respect to ruthenium or ruthenium(IV) oxide, for example by means of a selective etching step. In this case, the covering layer 3 does not have to be embodied homogeneously. It is also possible, for example, to use a layer stack in which the layer ranged at the very top has to required properties. One material which is suitable for the covering layer 3 is silicon dioxide, for example. If necessary, the covering layer 3 may be patterned in order to produce a mask 4 obtained from the covering layer 3. Customary methods can be used for this purpose. By way of example, it is possible to apply a photosensitive mask on the covering layer 3 (not illustrated).

Figure 1D:
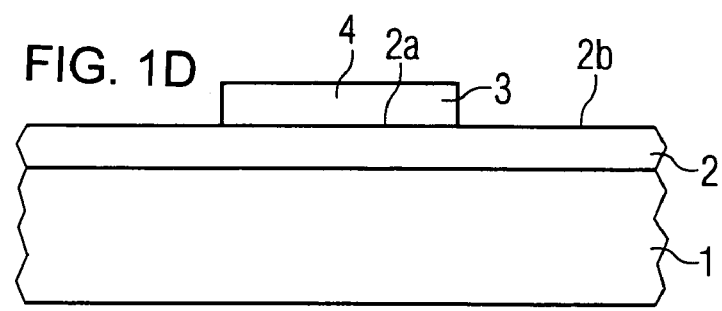
Figure 1E:
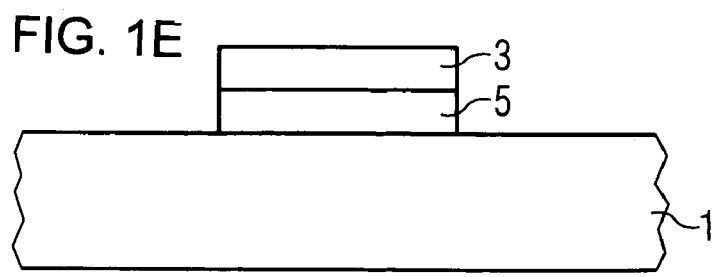

This photosensitive layer may subsequently be selectively exposed end developed. Uncovered regions of to covering layer 3 may 1then be removed in a selective etching step, so that the construction illustrated in FIG. 1D is obtained after the removal of the mask fabricated from the photosensitive layer. A continuous layer 2 made of ruthenium or ruthenium (IV) oxide is arranged on the substrate 1. A covering layer 3 forming the mask 4 is arranged on sections of the surface of the layer 2 made of ruthenium or ruthenium(IV) oxide, thereby obtaining sections 2a covered by the covering layer 3 and uncovered sections 2b of the layer 2 made of ruthenium or ruthenium(IV) oxide. The substrate illustrated in FIG. 1E is then heated in an oxygen atmosphere to a temperature which is preferably chosen to be greater than 800° C. In this case, the sections 2a of the layer 2 made of ruthenium or ruthenium(IV) oxide which are protected by the covering layer 3 are subjected to heat treatment, with the result that an improvement of the layer quality is achieved through a rearrangement of atoms or an elimination of unreacted groups of precursor compounds. In the uncovered sections 2b, the ruthenium or ruthenium(TV) oxide reacts with the oxygen of the oxygen atmosphere to form volatile ruthenium (VII)oxide ($RuO_4$). Said $RuO_4$ sublimates away at the chosen temperatures above 800° C., so that the uncovered sections 2b, of the layer 2 made of ruthenium or ruthenium(IV) oxide are removed and the construction illustrated in FIG. 1E is attained. A patterned layer 5 made of ruthenium or ruthenium (IV) oxide is arranged on the substrate 1, which layer is still covered by the covering layer 3 (or mask 4 ) in the case of the arrangement illustrated in FIGS. 1–5. If necessary, the covering layer 3 may be removed selectively with respect to the patterned layer 5 made of ruthenium or ruthenium(IV) oxide in a concluding step.

Figure 2H:
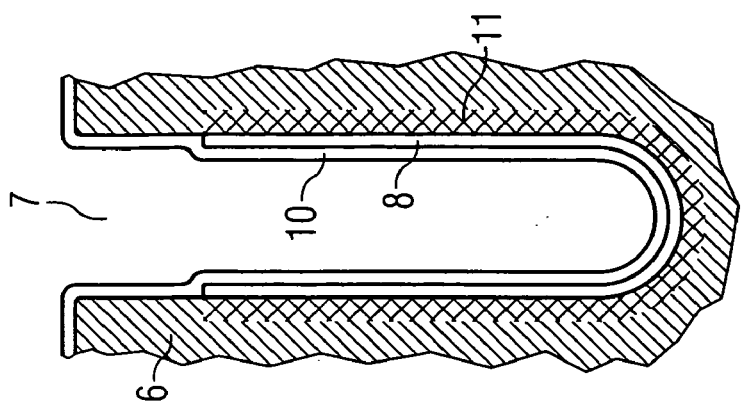
FIGS. 2A–V show a diagrammatic illustration of work steps which are run through in the fabrication of the trench capacitor.
Figure 2G:
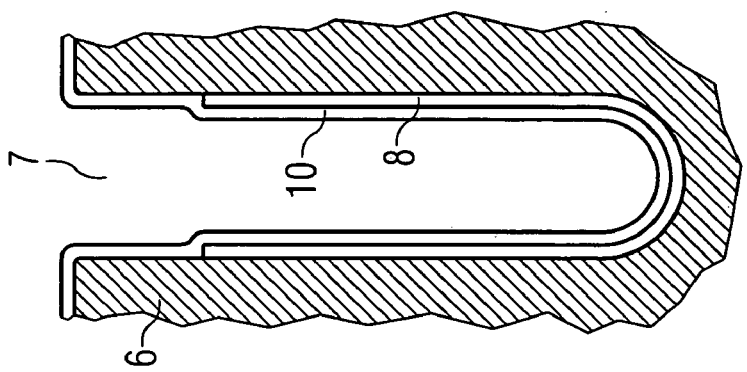
Figure 2F:
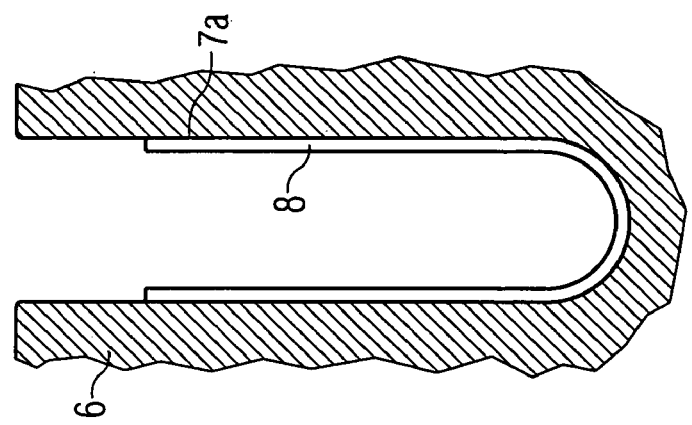
Figure 2E:
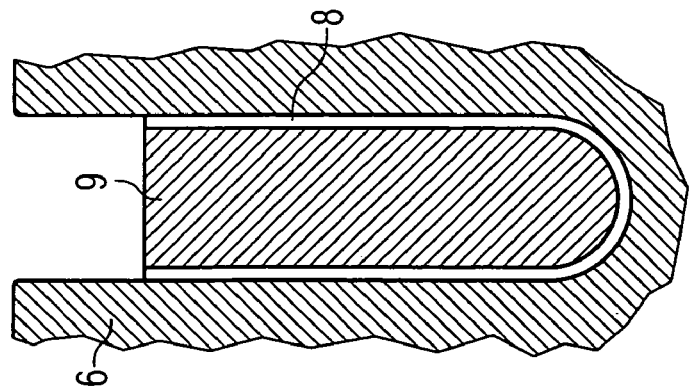
Figure 2L:
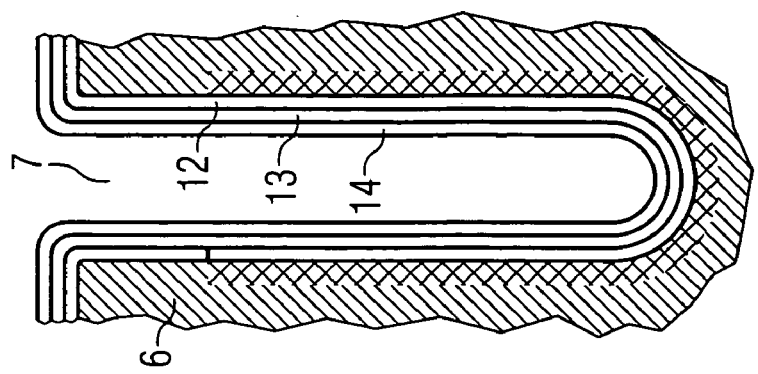
Figure 2K:
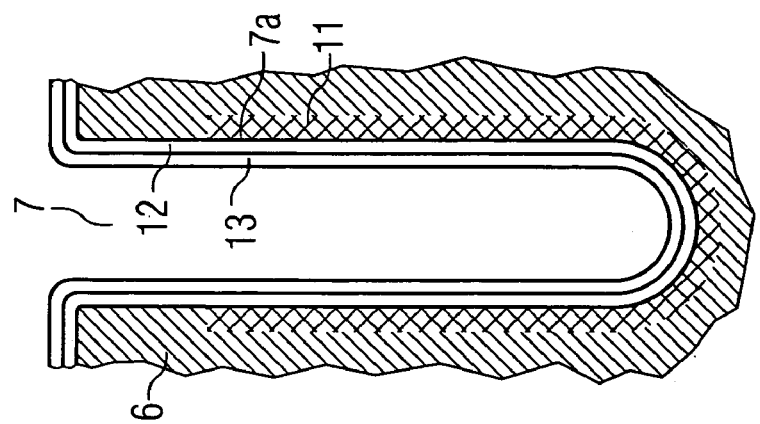
Figure 2J:
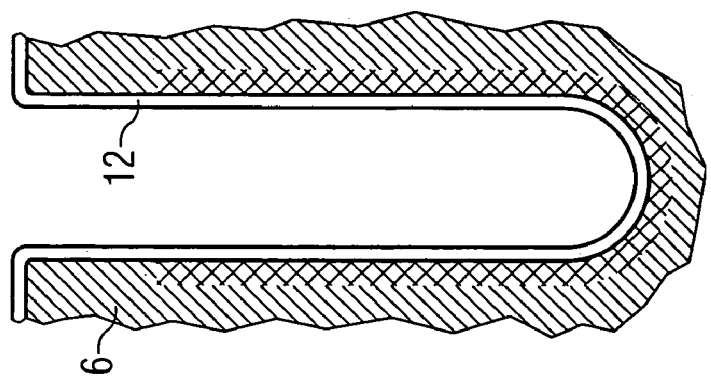
Figure 2I:
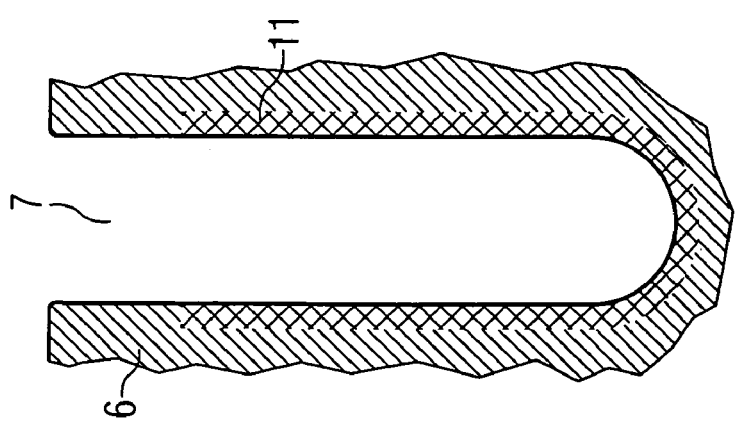
Figure 2Q:
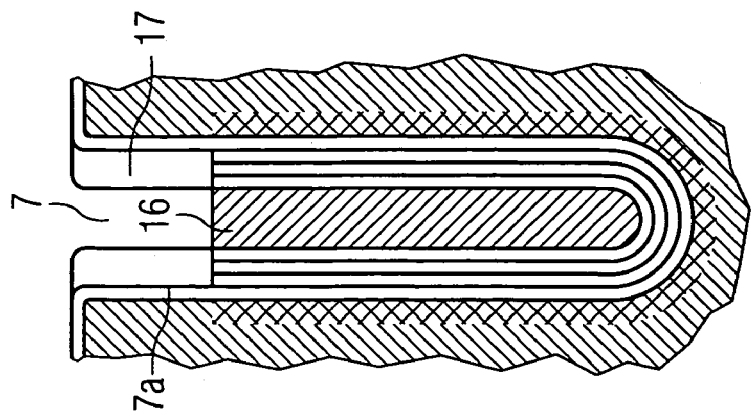
Figure 2R:
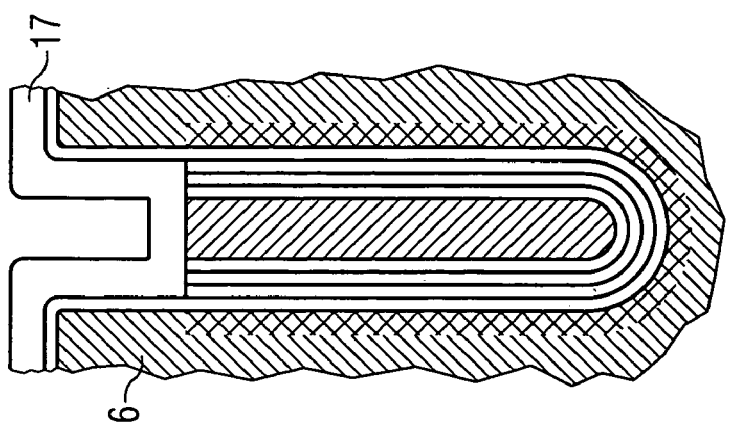
Figure 2S:
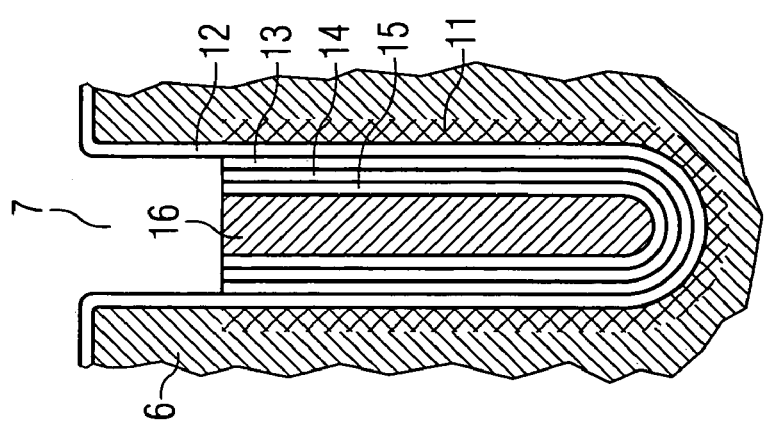
Figure 2T:
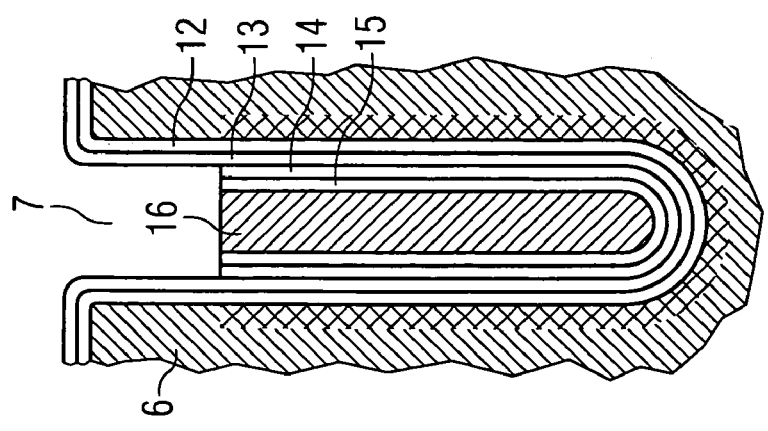

FIGS. 2A–V diagrammatically show a sequence of the essential work steps which are run through in the fabrication of a trench capacitor. The illustration in each case shows a section through a substrate 6, for example a silicon wafer, so that the trench or the trench capacitor is shown in lateral view. Firstly, a trench 7 is introduced into a silicon substrate 6 in a customary manner. To that end, by way of example, it is possible firstly to produce a suitable mask on the surface of the silicon substrate 6 and then to introduce the trench 7 into the silicon substrate 6 by etching using a fluorine-containing plasma. FIG. 2A diagrammatically shows the silicon substrate 6 and the trench 7 introduced into the latter. Covering layers, for example made of silicon nitride, may also be applied at the top side on the silicon substrate 6. For reasons of simplicity, however, these details have been omitted from the illustration. Firstly, a layer 8 made of arsenic glass is then deposited on the uncovered areas of the silicon substrate 6. In the illustration shown in FIG. 2B, the layer 8 made of arsenic glass covers the walls 7a of the trench 7. Depending on the diameter of the trench, however, it is also possible to fill the trench 7 completely with arsenic glass, so that no cavity remains within the trench 7. In order to delimit the region in which the silicon substrate 6 is intended to be doped, firstly, as illustrated in FIG. 2C, the cavity remaining in the trench 7 is filled with a filling 9 made, for example, of a resist. Next, as illustrated in FIG. 2D, the resist filling 9 is etched back isotropically down to a depth which essentially corresponds to the upper termination of the region to be doped, as illustrated in FIG. 2E. The uncovered regions of the layer 8 made of arsenic glass may then be removed, for example by means of isotropic wet-chemical etching. The resist filling 9 is subsequently removed, for example, by means of dry etching using an oxygen-containing plasma, with the result that the construction shown in FIG. 2F is attained. The sections of the trench wall 7*a* which terminate the region to be doped are covered with a layer 8 made of arsenic glass, while the regions of the substrate 6 which are not intended to be doped are uncovered or are not covered by the layer 8 made of arsenic glass. In order to avoid a contamination of the substrate 6 and to sharply demarcate the region to be doped, firstly a layer 10 of a covering oxide is deposited, which layer covers the uncovered regions of the surface of the substrate 6 and also the uncovered area of the layer 8 made of arsenic glass in the trench. This construction is illustrated diagrammatically in FIG. 2G. The substrate illustrated in FIG. 2G is then subjected to heat treatment, arsenic ions diffusing from the layer 8 made of arsenic glass into the adjoining regions of the substrate 6. A doped region 11 is formed, as illustrated in FIG. 2H, corresponding to the first electrode plate in the completed trench capacitor. The doped region 11 is also referred to as a "buried plate". For the further construction of the trench capacitor, firstly the layer 10 made of covering oxide used for the doping and the layer 8 made of arsenic glass are then removed. This can be done by means of a customary wet-chemical etching method. The state illustrated in FIG. 2I is obtained. The trench 7 is completely uncovered again. In the lower section of the trench 7, the regions 11 adjoining the trench wall 7*a* are provided with a doping. In the next step, the dielectric 12 is deposited as a thin layer. This is usually done by means of a CVD method or an ALD method. Customary compounds, such as silicon oxide or silicon nitride, may be used as the dielectric. However, it is also possible to use materials having a higher dielectric constant. Examples of such dielectrics are $Al_2O_3$, AlN, $TiO_2$, $Ta_2O_5$, $HfO_2$, $ZrO_2$, $WO_3$, $MoO_2$, $Y_2O_3$, $La_2O_3$, $CeO_2$ or else MgO. It is also possible to use combinations of these compounds. There are no particular restrictions here. Firstly a conductive barrier layer 13 maybe deposited onto the layer of the dielectric 12. Examples of materials that may be used for the conductive barrier layer 13 are TaN, TaSiN or else doped silicon. The conductive barrier layer 13 may likewise be applied by CVD or ALD methods. The construction then obtained is illustrated in FIG. 2K. Firstly the layer of the dielectric 12 is arranged on the trench wall 7*a* and a conductive barrier layer 13 is arranged in turn on said dielectric. A layer 14 made of ruthenium is then applied to the conductive barrier layer 13. The method is explained here using the example of the deposition of a ruthenium layer. However, a patterning of a layer made of ruthenium (IV) oxide may be carried out in an analogous manner. As illustrated in FIG. 2L, the layer 14 made of ruthenium covers the entire surface of the conductive barrier layer 13, so that the trench 7 is completely lined with the layer 14 made of ruthenium at its inner areas. In order to prevent a reaction or a diffusion of the ruthenium (or the ruthenium(IV) oxide) with or into the polysilicon that is later deposited in the trench 7, firstly a further, second barrier layer 15 may then be deposited on the layer 14 made of ruthenium, as illustrated in FIG. 2M. To that end, it is possible to use the materials mentioned in the case of the first conductive barrier layer 13 or else TiN, for example. As illustrated in FIG. 2N, the remaining inner space of the trench 7 is firstly completely filled with polysilicon 16, the top side of the substrate 6 also being covered with polysilicon 16. As illustrated in FIG. 2O, the polysilicon 16 is then removed again from the surface of the substrate 6 and also in the upper section of the trench 7. This can be achieved for example by means of isotropic etching using a fluorine-containing plasma. The regions of the second barrier layer 15 which are uncovered in the upper section of the trench 7 may then be removed. Since the layer 14 made of ruthenium arranged below the second barrier layer 15 is largely inert with respect to chemicals, comparatively aggressive chemicals may be used for removing the second barrier layer 15. As illustrated in FIG. 2P, the layer 14 made of ruthenium has then been uncovered in the upper sections of the trench 7. Uncovered sections 14*a* of the layer 14 made of ruthenium and covered sections 14*b* of the layer 14 made of ruthenium are thus obtained analogously to the method sequence illustrated in FIGS. 1A–E. Those sections of the second barrier layer 15 and of the filling made of polysilicon 16 which are arranged in the lower region of the trench 7 act as covering layer in this case. According to the invention, the arrangement illustrated in FIG. 2P is then heated to a temperature of more than 800° C. in an oxygen atmosphere. In this case, the ruthenium is converted into volatile $RuO_4$ in the uncovered sections 14*a*, with the result that the uncovered sections 14*a* of the layer 14 made of ruthenium are removed. A construction illustrated in FIG. 2Q is attained. The layer 14 made of ruthenium has been removed in the upper region of the trench 7, so that the corresponding sections of the inert conductive barrier layer 13 have been uncovered again. These uncovered sections of the first conductive barrier layer 13 may then likewise be removed, for example by means of a wet-chemical method. The construction illustrated in FIG. 2R is attained. The trench 7 has been uncovered in its upper section, while the two electrode plates of the capacitor have been produced in the lower section. In this case, the doped region 11 forms the bottom electrode, which adjoins the dielectric 12. The layer 14 made of ruthenium is arranged as top electrode on the opposite side of the dielectric 12, said layer made of ruthenium being bounded on both sides by a first conductive barrier layer 13 and a second conductive barrier layer 15. This layer sequence is finally supplemented by a conductive filling made of polysilicon 16. In order to insulate the trench 7 in its upper section from the silicon substrate 6, an oxide collar is then constructed with the aid of a CVD or ALD method. To that end, as illustrated in FIG. 2S, an oxide layer 17 is deposited on the uncovered areas. In order to be able to produce an electrical connection to the top electrode, the oxide layer 17 is subsequently etched anisotropically using a suitable plasma. As illustrated in FIG. 2T, in this case the oxide layer 17 remains on the sections of the trench wall 7*a* which are arranged in the upper region of the trench 7 and the surface of the top electrode, that is to say the surface of the filling made of polysilicon 16 in the case of the illustration chosen in FIG. 2T, is uncovered again. The upper section of the trench 7 is then filled with polysilicon. To that end, firstly polysilicon 16 is deposited again, the trench 7, as illustrated in FIG. 2U, being overfilled. Excess polysilicon 16 is subsequently etched back isotropically, with the result that the illustration shown in FIG. 2V is attained. The trench capacitor comprises with the doped region 11 a bottom electrode which is separated from the top electrode by a dielectric 12. The top electrode is formed from a layer 14 made of ruthenium and the filling 16 made of polysilicon. In order to avoid a reaction between individual components of the top electrode or with the material of the dielectric, the layer 14 made of ruthenium is bounded on both sides in each case by a first conductive barrier layer 13 and a second conductive barrier layer 15. In the upper region of the trench capacitor, the top electrode is insulated from the substrate 6 by a collar 18, so that leakage currents are largely sup pressed. In order to construct a memory cell of a DRAM, the procedure then continues in a customary manner, that is to say a transistor is constructed, the drain electrode of which is connected for example to the filling 16 made of polysilicon which forms the top electrode.

Thus, the procedure is generally such that firstly a first electrode plate having a high electrical conductivity is provided on the substrate. A layer made of a dielectric is then deposited on the first electrode plate, the layer made of ruthenium or ruthenium(IV) oxide being deposited in turn onto said layer made of a dielectric. This layer structure is suitable for the fabrication of capacitors with an inherently arbitrary design. Thus, the patterned ruthenium electrodes may be used both for trench capacitors and for stacked capacitors. Equally, it is also possible to realize a planar design in which planar layers are respectively stacked one above the other.

The first electrode plate is generally fabricated in such a way that firstly a doped section is produced in the semiconductor substrate. To that end, a suitable dopant may be introduced into the semiconductor substrate in a customary manner. Firstly, the sections to be doped are defined in a suitable manner, for example by filling a trench with an arsenic glass up to the desired depth. During the subsequent heat treatment, only the lower sections of the trench capacitor are then doped. A doping from the gas phase is likewise possible. To that end, those regions of the substrate which are intended to remain free of the doping must firstly be covered with a diffusion barrier. Customary methods known to the person skilled in the art are thus used for the fabrication of the first electrode plate. There are no particular restrictions here.

In order to avoid the formation of space charge zones, in a preferred embodiment, a layer made of metal or a material having a high electrical conductivity is additionally deposited on the doped sections of the semiconductor substrate. The metal or the material having a high electrical conductivity may inherently be chosen in an arbitrary manner. By way of example, the materials mentioned in the introduction are suitable. However, the metal layer may also comprise for example ruthenium or ruthenium(IV) oxide as material having a high electrical conductivity.

In the case of use as an electrode, a layer made of polysilicon may also be deposited on the layer made of ruthenium or ruthenium(IV) oxide. This arrangement is preferably chosen when the electrode is formed as a top electrode of a trench capacitor. The connection of the electrode e.g. to a transistor may then be effected via the filling with polysilicon. In order to increase the electrical conductivity the layer made of polysilicon may also be provided with a doping.

In order to avoid a reaction between individual layers which would lead to a destruction of the layer structure, a barrier layer is preferably deposited between the first electrode section and the layer made of a dielectric and/or between the layer made of a dielectric and the layer made of ruthenium or ruthenium(IV) oxide and/or between the layer made of ruthenium or ruthenium(IV) oxide and the layer made of doped polysilicon. Customary materials are used for this purpose. By way of example, TaN, TaSiN, doped silicon, or else TiN are suitable. Particular restrictions do not exist. The barrier layer should not lose its barrier function even at relatively high temperatures and should not decompose, or should not react with constituents of adjacent layers, for example, at the high temperatures required.

The heat treatment step in which the uncovered sections of the layer made of ruthenium or ruthenium(IV) oxide are removed can be carried out both in conventional furnaces and in RTP installations. RTP installations (RTP=Rapid Thermal Processing) are preferred since rapid processing is possible in these installations.

The method according to the invention enables the simple fabrication and patterning of layers made of ruthenium or ruthenium(IV) oxide which have a high electrical conductivity. Layers of this type are suitable in particular for use as an electrode in capacitors. Therefore, the invention also relates to a capacitor having a first electrode plate and a second electrode plate and a layer made of a dielectric formed between first electrode plate and second electrode plate, wherein at least one of the electrode plates is formed from ruthenium or ruthenium(IV) oxide in at least sections.

The use of ruthenium or ruthenium(IV) oxide makes it possible to achieve a high surface charge density on the electrode surface. The capacitors according to the invention can therefore be fabricated in very small dimensions. Owing to the low electrical resistance, it is also possible to realize very short writing or reading times when using the capacitor as a storage element.

In a particularly preferred embodiment, therefore, the capacitor is formed as a trench capacitor in a semiconductor substrate, in which the first electrode plate is formed as a doped section of the semiconductor substrate in a trench wall and the second electrode plate is formed from ruthenium or ruthenium(IV) oxide at least in sections.

In this embodiment of the capacitor according to the invention, the construction is effected in an inherently customary manner, but the top electrode is supplemented by a transistor to form a memory cell. Through the transistor, an electrode of the storage capacitor is connected to the bit line of the chip.

The method according to the invention has been explained using the example of a trench capacitor in which one electrode is formed from a semiconductor and the other electrode is formed from a ruthenium layer. However, it is also possible to form both electrodes as metal electrodes. To that end, by way of example, proceeding from the construction shown in FIG. 21, it is possible firstly to apply a metal layer on the sections of the wall of the trench 7 which are adjoined by the doped regions 111. For this purpose, by way of example, it is likewise possible to use a layer ma de of ruthenium or ruthenium(IV) oxide. However, it is also possible to use other materials which have a high electrical conductivity, for example Al, W, Ta, Ti, Hf, Zr, Mo, Y, La, Ce and also the electrically conductive nitrides of these metals, as well as alloys of these metals and also the electrically conductive nitrides thereof which contain a plurality of the abovementioned metals. There are no particular restrictions here.

In the case of the method illustrated in FIGS. 2A–V, the collar 18 was fabricated after the construction of the top electrode constructed from the layer 14 made of ruthenium and the filling made of polysilicon 16. However, it is also possible firstly to produce the collar 18 in the trench 7 and only afterward to fabricate the top electrode constructed from the layer 14 made of ruthenium and the filling made of polysilicon 16. In this case, the person skilled in the art can correspondingly vary the known methods for the fabrication of trench capacitors.

The foregoing disclosure of the preferred embodiments of the present invention has been presented for purposes of illustration and description. It is not formed from ruthenium or ruthenium(IV) oxide at least in sections. The trench capacitor is formed in customary dimensions in this case.

The extent of the trench capacitor into the depth of the substrate is generally between 1 and 10 µm, preferably between 5 and 10 µm, while the diameter of the trench is chosen to be less than 300 nm, preferably less than 200 nm.

The second electrode need not be formed completely from ruthenium or ruthenium(IV) oxide. It is also possible to form the electrode as a layer stack, a first layer made of ruthenium or ruthenium(IV) oxide being formed and at least a second layer made of polysilicon. In this case, the layer formed from ruthenium or ruthenium(IV) oxide is arranged adjacent to the dielectric.

In order also to achieve a highest possible surface charge density on the first electrode plate, or to keep the electrical resistance of the electrode as low as possible, the first electrode plate may also be supplemented by a layer made of metal or made of a material having a high electrical conductivity arranged on the doped sections. The materials described above may once again be used as metal or material having a high electrical conductivity.

In order to avoid leakage currents leading to a premature discharge of the capacitor, the trench capacitor may be provided with an insulation section in its upper section, that is to say in a region of the trench wall adjoining the opening of the trench capacitor. Such an insulation section is suitably embodied as a collar.

The capacitor according to the invention is particularly suitable for use as a storage element in a memory chip (DRAM). To that end, the capacitor is suitably intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A capacitor having a first electrode plate and a second electrode plate and a layer made of a dielectric formed between the first electrode plate and the second electrode plate, wherein the second electrode plate is formed from at least a layer made of ruthenium or ruthenium(IV) oxide and a layer made of polysilicon, wherein the capacitor is formed as a trench capacitor in a semiconductor substrate, in which the first electrode plate is formed as a doped section of the semiconductor substrate in a trench wall.

2. The capacitor of claim 1, wherein the first electrode plate is at least one of supplemented by a layer made of metal or made of an electrically highly conductive material arranged on doped sections.

3. The capacitor of claim 1, wherein the capacitor is formed as a trench capacitor in a semiconductor substrate and wherein an insulation section is provided in the upper region of a trench wall adjoining an opening of the trench capacitor.

4. The capacitor of claim 1, wherein at least one of the electrode plates is formed from ruthenium.

5. The capacitor of claim 1, wherein at least one of the electrode plates is formed from ruthenium(IV) oxide.

6. A capacitor having a first electrode plate and a second electrode plate and a layer made of a dielectric formed between the first electrode plate and the second electrode plate, wherein at least a portion of one of the electrode plates is formed from ruthenium or ruthenium(IV) oxide, wherein the capacitor is formed as a trench capacitor in a semiconductor substrate, and wherein an insulation section is provided in an upper region of a trench wall adjoining an opening of the trench capacitor, wherein the first electrode plate is formed as a doped section of the semiconductor substrate in the trench wall and the second electrode plate is formed at least in part from ruthenium or ruthenium(IV) oxide.

7. The capacitor of claim 6, further comprising a barrier layer disposed between the layer made of a dielectric and the second electrode plate.

8. The capacitor of claim 6, wherein the second electrode plate is further formed from a layer made of polysilicon.

9. The capacitor of claim 8, further comprising a first barrier layer disposed between the ruthenium or ruthenium (IV) oxide and the layer made of polysilicon.

10. The capacitor of claim 9, further comprising a second barrier layer disposed between the layer made of a dielectric and the second electrode plate.

11. The capacitor of claim 6, wherein the first electrode plate is at least one of supplemented by a layer made of metal or made of an electrically highly conductive material arranged on the doped sections.

12. The capacitor of claim 6, wherein at least one of the electrode plates is formed from ruthenium.

13. The capacitor of claim 6, wherein at least one of the electrode plates is formed from ruthenium(IV) oxide.

14. A capacitor having a first electrode plate and a second electrode plate and a layer made of a dielectric formed between the first electrode plate and the second electrode plate, wherein the second electrode plate is formed from at least a layer made of ruthenium or ruthenium(IV) oxide and a layer made of polysilicon, wherein the capacitor is formed as a trench capacitor in a semiconductor substrate, in which the first electrode plate is formed as a doped section of the semiconductor substrate in a trench wall, the capacitor further comprising a barrier layer between the layer made of ruthenium or ruthenium(IV) oxide and the layer made of polysilicon.

15. A capacitor comprising:
a first electrode that includes a first sidewall, a bottom surface and a second sidewall, the first sidewall, the bottom surface and the second sidewall forming an enclosure;
a dielectric layer overlying the first sidewall, the bottom surface and the second sidewall;
a metal layer overlying the dielectric layer and lining the first sidewall, the bottom surface and the second sidewall, the metal layer comprising ruthenium or ruthenium(IV) oxide; and
at least one material overlying the metal layer and filling at least a portion of the enclosure, wherein the at least one material comprises polysilicon.

16. The capacitor of claim 15, further comprising:

a first barrier layer between the dielectric layer and the metal layer; and a second barrier layer between the metal layer and the at least one material.

17. The capacitor of claim 15, wherein the first electrode comprises doped silicon.

18. The capacitor of claim 17, wherein the capacitor comprises a trench capacitor, wherein the doped silicon is formed along sidewalls of a trench formed in a silicon body, wherein the dielectric layer and the metal layer line the sidewalls of the trench, and wherein the at least one material comprises a conductive layer that fills at least a portion of the trench.

* * * * *